United States Patent [19]

Yamawaki

[11] Patent Number: 5,305,130
[45] Date of Patent: Apr. 19, 1994

[54] CONNECTING TAPE, FILM CARRIER TYPE IC FOR DRIVING A LIQUID CRYSTAL DISPLAY PANEL AND METHOD FOR MAKING WIRING INTERCONNECTIONS

[75] Inventor: Tatsushi Yamawaki, Tokyo, Japan
[73] Assignee: NEC Corporation, Japan
[21] Appl. No.: 53,884
[22] Filed: Apr. 27, 1993

[30] Foreign Application Priority Data

Apr. 28, 1992 [JP] Japan ............... 4-109420

[51] Int. Cl.⁵ .................. G02F 1/13
[52] U.S. Cl. .................. 359/88; 359/87; 257/734; 257/784
[58] Field of Search .......... 359/87, 88, 89; 257/668, 734, 775, 776, 784; 340/784

[56] References Cited

U.S. PATENT DOCUMENTS 4,985,663  1/1991  Nakatani ............... 359/88
5,189,539  2/1993  Suzuki ................. 359/88

FOREIGN PATENT DOCUMENTS 2-208634  8/1990  Japan ................ 359/88
4-147223  5/1992  Japan ................ 359/88

Primary Examiner—Rolf Hille
Assistant Examiner—Minhloan Tran
Attorney, Agent, or Firm—Laff, Whitesel, Conte, Saret

[57] ABSTRACT

A connecting tape for interconnecting wiring lines on a liquid crystal display panel and those on a driver IC is constituted by an insulating tape having wiring layers provided thereon. The wiring layers have a plurality of first pitch group wiring layers on an upper surface of one of end sides of the insulating tape and a plurality of second pitch group wiring layers on an upper surface of the other of the end sides of the insulating tape, with the second pitch group having pitches different from those of the first pitch group wiring layers. The first pitch group wiring layers are adapted to be aligned and connected with wiring lines of the liquid crystal display panel which lines are arranged in the same pitches as those of the first pitch group wiring layers, and the second pitch group wiring layers are adapted to be aligned and connected with wiring lines of the driver IC. There can be a number of different pitch group wiring layers and of different pitch group wiring lines. It is possible to connect one given kind of film carrier type liquid crystal display driver IC with a number of liquid crystal display panels having wiring lines whose pitches are different from those in the liquid crystal display driver IC. This can save costs and time in the fabrication of the product concerned.

8 Claims, 5 Drawing Sheets

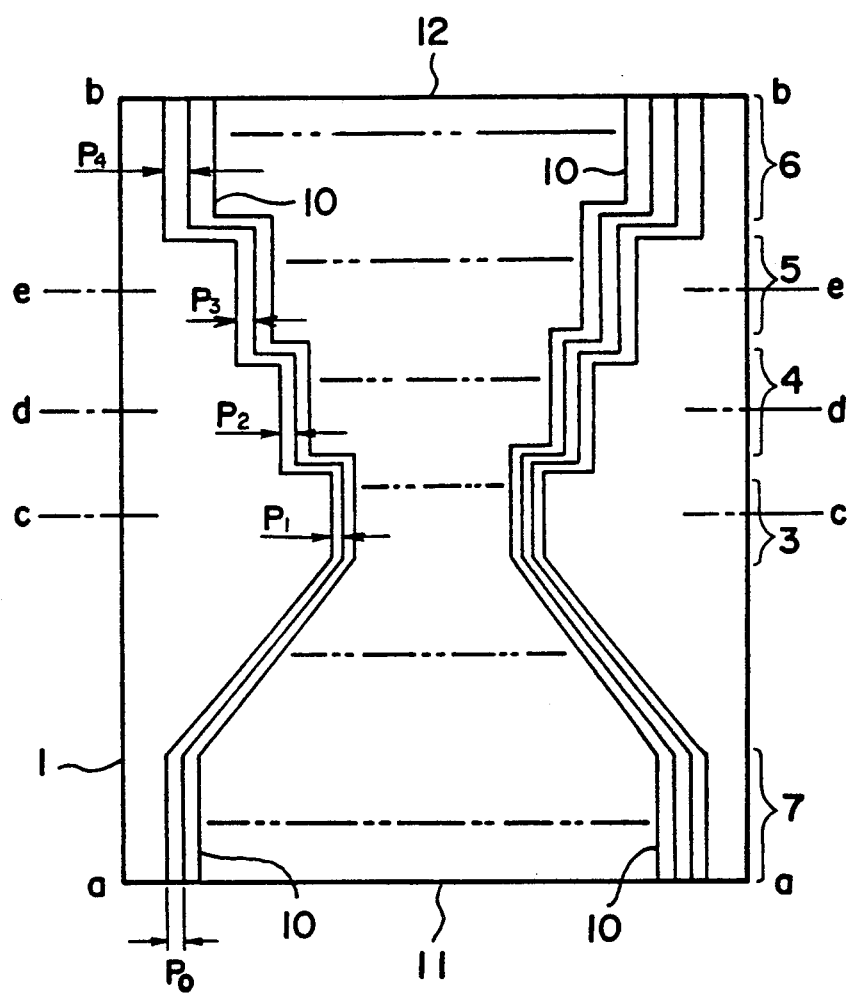

CONNECTING TAPE, FILM CARRIER TYPE IC FOR DRIVING A LIQUID CRYSTAL DISPLAY PANEL AND METHOD FOR MAKING WIRING INTERCONNECTIONS

BACKGROUND OF THE INVENTION

1. Field of the Invention

The present invention relates to a connecting tape, a film carrier type IC and a method for making wiring connections, and more particularly to a connecting tape for connecting a liquid crystal display (LCD) panel with a film carrier type IC, a film carrier type IC for driving a liquid crystal display panel, and method for making wiring connections between the liquid crystal display panel and the film carrier type IC.

2. Description of the Related Art

Conventionally, the pitches of output wiring lines in a polyimide film carrier type IC for driving a liquid crystal display mounted with a liquid crystal display driver IC have been designed in accordance with pitches of particular picture element wiring lines with which the output wiring lines of such IC are connected. Such a conventional arrangement is first explained with reference to FIGS. 1A–1C. The polyimide film carrier type IC 40 has a number of wiring lines 42 formed on a polyimide film 41, and an IC chip 43 for driving a liquid crystal display is connected to an end of an inner side of the wiring lines 42 having pitches $P_0$ at an end of an outer side of the wiring lines 42 (as illustrated in FIG. 1B). On the other hand, a liquid crystal display panel 30 has a number of picture element wiring lines 32 formed on the substrate 31 in the same pitches $P_0$ as those on the polyimide film 41 (as illustrated in FIG. 1A). As shown in FIG. 1C, both the wiring lines 32 and 42 are electrically connected together by electrically conductive resin 45. In these drawings, the plurality of wiring lines 32 and 42 are illustrated simply in lines by omitting the showing of actual widths of such lines.

In the case of the conventional connecting tape as explained above, it is not possible to connect a specifically designed liquid crystal display driver IC with a liquid crystal display panel having picture element wiring lines whose pitches are different from those in the liquid crystal display driver IC. In such a case, it is necessary to design newly a polyimide film carrier in which the pitches of the output wiring lines are changed.

Therefore, when the conventional technology is used, there is a problem in that the required new designing and fabrication of a polyimide film carrier type liquid crystal display driver IC unavoidably involves additional costs and time, which is uneconomical and has been a barrier to an efficient development of the product concerned. This is a problem to be solved by the invention, in the conventional technology.

SUMMARY OF THE INVENTION

It is, therefore, an object of the present invention to overcome the shortcoming in the conventional connecting tape and the conventional method for connecting the liquid crystal display panel with the film carrier type IC for driving liquid crystal display and to provide an improved connecting tape and method for the wiring connections.

According to one aspect or feature of the invention, there is provided a connecting tape for interconnecting wiring lines on a liquid crystal display panel and those on a driver IC, the connecting tape being constituted by an insulating tape having wiring layers provided on the insulating tape, the wiring layers comprising:

a plurality of first pitch group wiring layers on an upper surface of one of end sides of the insulating tape;

a plurality of second pitch group wiring layers on an upper surface of the other of the end sides of the insulating tape, the second pitch group having pitches different from those of the first pitch group wiring layers, the first pitch group wiring layers on the upper surface of the one of the end sides of the insulating tape being adapted to be aligned and connected with wiring lines of the liquid crystal display panel which lines are arranged in the same pitches as those of the first pitch group wiring layers, and the second pitch group wiring layers provided on the upper surface of the other of the end sides of the insulating tape being adapted to be aligned and connected with wiring lines of the driver IC. Preferably, the insulating tape is a tape of polyimide film.

According to a second aspect of the invention, there is provided a method for interconnecting wiring lines on a liquid crystal display panel and those on a driver IC, the method comprising the steps of:

providing an original tape constituted by an insulating tape having a plurality of groups of wiring layers which are arranged on an upper surface of the insulating tape and pitches of which are different from each other;

cutting the original tape at a predetermined portion to form a first end portion of the insulating tape;

connecting a first pitch portion of the plurality of groups of wiring layers located on an upper surface of the first end portion with wiring lines of the same first pitch in one of the liquid crystal display panel and the driver IC; and connecting a second pitch portion of the plurality of groups of wiring layers located on an upper surface of a second end portion of the insulating tape with wiring lines of the same second pitch portion in the other one of the liquid crystal display panel and the driver IC. The second end portion of the insulating tape may be formed by cutting a portion other than the predetermined portion of the green tape. The insulating the insulating tape is preferably a tape of polyimide film.

According to a third aspect of the invention, there is provided a film carrier type IC for driving a liquid crystal display, comprising:

a plurality of groups of wiring lines formed on an upper surface of an insulating film;

a liquid crystal display driver IC chip connected to a first end portion of the plurality of groups of wiring lines;

a plurality of first pitch groups of wiring lines provided at a second end portion of the plurality of groups of wiring lines; and a plurality of other pitch groups including second pitch groups of the wiring lines located at a plurality of portions between the first end portion and the second end portion of the plurality of groups of wiring lines, the other pitch groups having pitches different from each other and from those of the first pitch groups. The insulating tape is preferably a tape of polyimide film.

According to a fourth aspect of the invention, there is provided a method for interconnecting wiring lines of a film carrier type IC with a substrate of a liquid crystal display panel, the method comprising the steps of:

providing a film carrier type IC by arranging a plurality of groups of wiring lines on an upper surface of an insulating film, connecting an IC chip to a first end portion of the plurality of groups of wiring lines, arranging the plurality of groups of wiring lines located at a second end portion thereof to be in a first pitch, and arranging the plurality of groups of wiring lines located at a plurality of portions between the first end portion and the second end portion to be in a second pitch or other pitches different from each other and from those of the first pitch group of the wiring lines;

cutting the insulating film having the wiring lines in predetermined pitches and the plurality of groups of wiring lines in a manner that a number of cut end portions in predetermined pitches are present on a surface in a vicinity of a cut line of the insulating film; and connecting the cut end portions having the wiring lines in predetermined pitches with wiring lines on the substrate having the same pitches as the predetermined pitches.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2 is a plan view showing a connecting tape of a first embodiment according to the invention;

PREFERRED EMBODIMENTS OF THE INVENTION

Figure 1A:
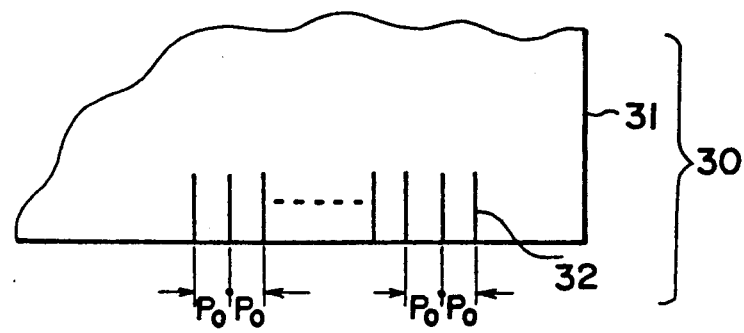
FIGS. 1A, 1B and 1C are diagrams for illustrating a conventional method for connecting a liquid crystal display panel with a polyimide film carrier type IC for driving a liquid crystal display, FIG. 1A being a plan view showing the liquid crystal display panel, FIG. 1B being a plan view showing the polyimide film carrier type IC for driving a liquid crystal display, and FIG. 1C being a sectional view showing a state in which the connection of the liquid crystal display panel with the polyimide film carrier type IC has been completed.

Now, preferred embodiments of the invention are explained with reference to the drawings.

FIG. 2 shows in plan view a connecting tape for connecting a liquid crystal display panel and a film carrier type IC for driving a liquid crystal display according to a first embodiment of the invention. A polyimide film tape 1 which is an insulating tape of a rectangular shape with a size of 3–4 cm × 10 cm carries on a surface thereof a number of wiring layers 10 formed from a copper foil plated with tin. The wiring layers 10 on an upper surface 7 at the side of a first end portion 11 (a—a line) of the insulating tape 1 are arranged in a first pitch $P_0$ while the wiring layers 10 on an upper surface 6 at the side of a second end portion 12 (b—b line) opposite to the first end portion 11 are arranged in a second pitch $P_4$. Further, between the first end portion 11 and the second end portion 12, the wiring layers 10 at a portion 3 (c—c line) are arranged in a pitch $P_1$, at a portion 4 (d—d line) in a pitch $P_2$, and at a portion 5 (e—e line) in a pitch $P_3$, respectively. It should be noted that the values of these pitches are different from one another. For example, $P_0$ may be 250 μm, $P_1$ may be 100 μm, and $P_2$ may be 130 μm. These values are determined from the wiring line pitches used in all possible kinds of the ICs and the liquid crystal display panels to be connected. It is possible to arrange that the value $P_0$ be larger than $P_3$ and $P_4$.

Figure 1B:
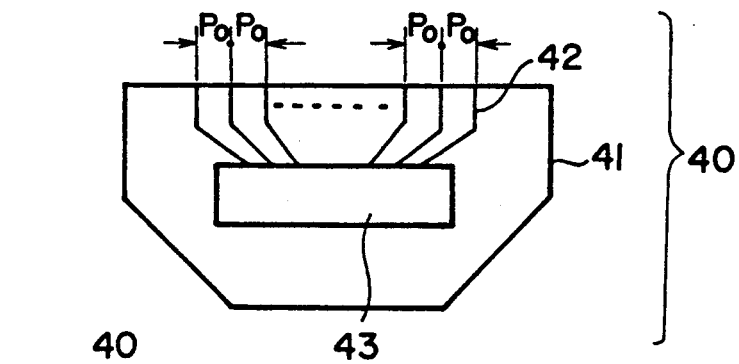
Figure 1C:
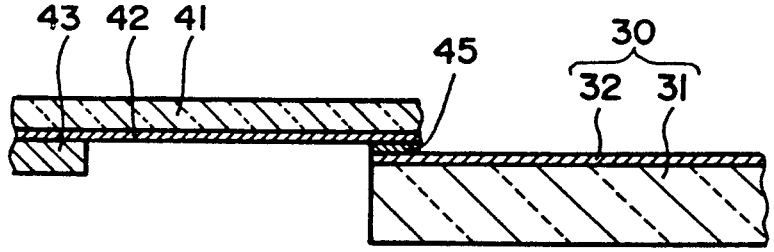
Figure 3A:
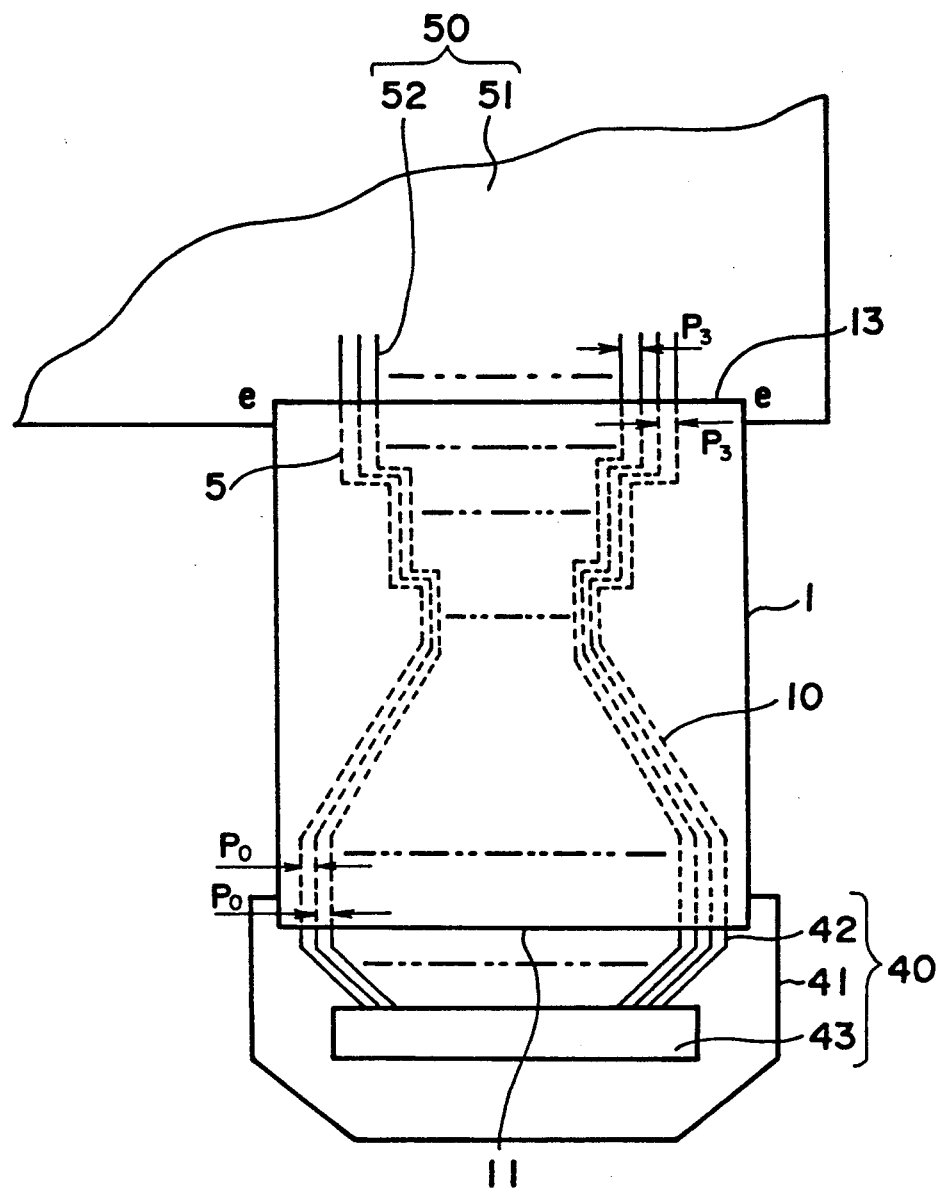
FIGS. 3A and 3B are diagrams showing a state in which the liquid crystal display panel and the polyimide film carrier type IC have been connected with each other by the connecting tape, FIG. 3A being a plan view thereof and FIG. 3B being a sectional view thereof.
Figure 3B:
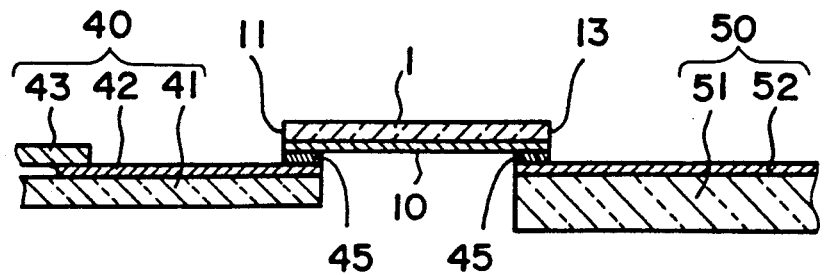

FIGS. 3A and 3B are for illustrating a method for connecting the liquid crystal display panel with the driver IC by using the tape shown in FIG. 2. A polyimide film carrier type IC 40 for driving a liquid crystal display is, similarly as the one shown in FIG. 1, arranged such that a number of wiring lines 42 are formed on a polyimide film 41, and an IC chip 43 for driving a liquid crystal display is connected to an end portion at an inner side of the wiring lines 42. The wiring lines 42 at an end portion at an outer side thereof are arranged in pitch $P_0$. The liquid crystal display panel 50 has a number of picture element wiring lines 52 formed from, for example, aluminum, on a substrate 51 in pitch $P_3$.

In the arrangement shown in FIG. 2, the portion 5 (e—e line) of the original tape is cut in parallel to the end portion 12 by such means as a cutter knife and this provides a connecting tape having the wiring layers 10 with pitch $P_3$ located on the upper surface at the side of the end portion 13. Since the wiring layers 10 at the side of the end portion 11 have the same pitch $P_0$ as that in the wiring lines 42 of the IC, they are connected together as they are by ohmic contact using electrically conductive resin 45. The wiring layers 10 cut at the end portion 13 have the same pitch $P_3$ as that in the picture element wiring lines 52 so that, similarly, they are connected together by ohmic contact using electrically conductive resin 45. In this way, the liquid crystal display panel 50 and the driver IC 43 are connected together by the connecting tape according to the invention. The connecting method may be a thermocompression bonding method. In FIGS. 2, 3A and 3B, the wiring layers 10 and the wiring lines 42 and 52 are illustrated simply in lines by omitting the showing of actual widths of such layers and lines.

In the above explained example, the portion of the tape at the side at which it is connected with the liquid crystal display panel is cut. However, where the pitches of the wiring lines in the IC are different from those of the wiring layers positioned at the related end portion of the original tape, it is possible to cut the tape at a portion at the side at which it is connected with the IC. It is also possible to cut the tape both at the side at which it is connected with the liquid crystal display panel and at the side at which it is connected with the IC, by selecting the locations at which the wiring layer pitches match the wiring line pitches.

Figure 4:
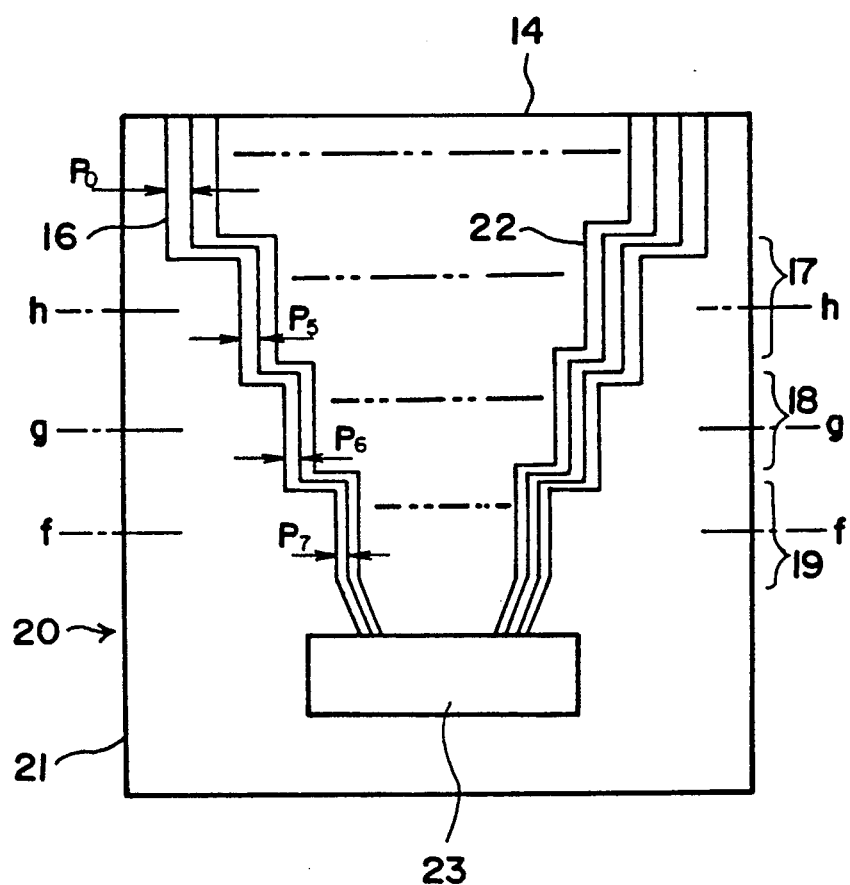
FIG. 4 is a plan view showing a polyimide film carrier type IC of a second embodiment according to the invention.

FIG. 4 shows in plan view a polyimide film carrier type IC 20 for driving a liquid crystal display according to a second embodiment of the invention. A number of wiring lines 22 formed from copper foils plated with tin are provided on an upper surface of a polyimide film 21. To one end of the inner side of the wiring lines 22, the IC chip 23 for driving a liquid crystal display is connected by a solder bump method or a thermocompression bonding method. The wiring lines 22 are arranged in pitch $P_0$ at a portion 16 on the upper surface on the side of the end portion 14 of the film 21 and the wiring lines 22 between this portion 16 and the inner end portion of the wiring lines at which the connection is made with the IC chip 23 are arranged in pitch $P_5$ at a portion 17 (h—h line), in pitch $P_6$ at a portion 18 (g—g line), and in pitch $P_7$ at a portion 19 (f—f line), respectively. It should be noted that the values of these pitches are different from each other.

Figure 5A:
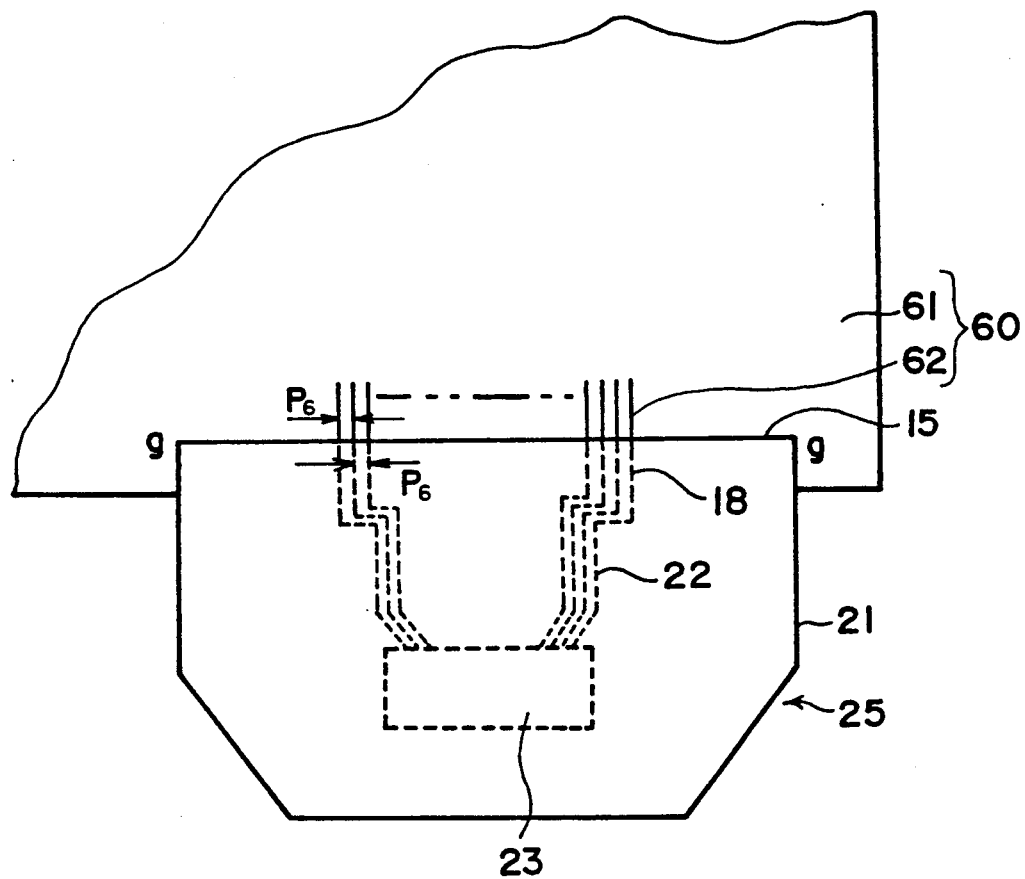
FIGS. 5A and 5B are diagrams showing a state in which the polyimide film carrier type IC for driving a liquid crystal display is connected with the liquid crystal display panel, FIG. 5A being a plan view thereof and FIG. 5B being a sectional view thereof.
Figure 5B:
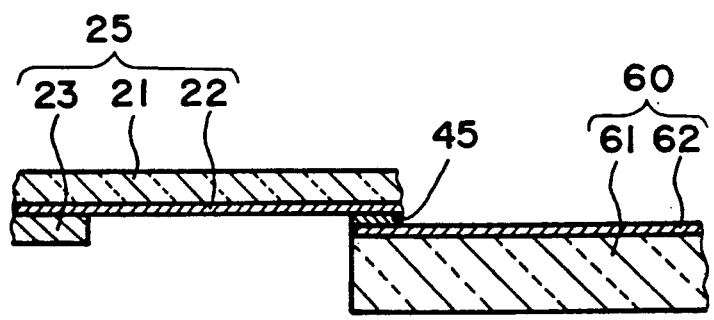

FIG. 5A illustrates a method for connecting the driver IC shown in FIG. 4 with the liquid crystal display panel 60. The liquid crystal display panel 60 has a number of picture element wiring lines 62 arranged in pitch $P_6$ on an upper surface of the substrate 61. Thus, the original film 21 shown in FIG. 4 is cut at a portion 18 (g—g line) in parallel with respect to the end portion 14 of the original film 21 and this provides a driver IC 25 in which, on the upper surface at the side of the end portion 15, the wiring lines 22 with the pitch $P_6$ are present. These wiring lines 22 are made ohmic contact with the picture element wiring lines 62 on the liquid crystal display panel by using electrically conductive resin 45 or by a thermocompression bonding method. In FIGS. 4, 5A and 5B, similarly as in other drawings, the wiring lines 22 and 62 are illustrated simply in lines by omitting the showing of actual widths of such lines.

As explained above, according to the invention, it is possible to connect one given kind of polyimide film carrier type IC for driving a liquid crystal display with a number of liquid crystal display panels having picture element wiring lines whose pitches are different from those in the liquid crystal display driver IC. Thus, it is not necessary to design a polyimide film carrier for each of such liquid crystal display panels, and this saves costs and time in the fabrication of the product concerned.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A connecting tape for interconnecting wiring lines on a liquid crystal display panel and those on a driver IC, said connecting tape being constituted by an insulating tape having wiring layers provided on said insulating tape, said wiring layers comprising:
   a plurality of first pitch group wiring layers on an upper surface of one of end sides of said insulating tape; and
   a plurality of second pitch group wiring layers on an upper surface of the other of the end sides of said insulating tape, said second pitch group having pitches different from those of said first pitch group wiring layers,
   said first pitch group wiring layers on the upper surface of said one of the end sides of said insulating tape being adapted to be aligned and connected with wiring lines of said liquid crystal display panel which lines are arranged in the same pitches as those of said first pitch group wiring layers, and said second pitch group wiring layers provided on the upper surface of the other of the end sides of said insulating tape being adapted to be aligned and connected with wiring lines of said driver IC.

2. A connecting tape for interconnecting wiring lines on a liquid crystal display panel and those on a driver IC according to claim 1, in which said plurality of wiring layers include a plurality of third pitch group wiring layers pitches of which are different from both said first pitches and said second pitches and which are located between said one of the end sides and the other of the end sides of said insulating tape.

3. A connecting tape for interconnecting wiring lines on a liquid crystal display panel and those on a driver IC according to claim 1, which is connected to said liquid crystal display panel and said driver IC.

4. A connecting tape for interconnecting wiring lines on a liquid crystal display panel and those on a driver IC according to claim 1, in which said insulating tape is a tape of polyimide film.

5. A connecting tape for interconnecting wiring lines on a liquid crystal display panel and those on a driver IC according to claim 2, in which said insulating tape is a tape of polyimide film.

6. A film carrier type IC for driving a liquid crystal display, comprising:
   a plurality of groups of wiring lines formed on an upper surface of an insulating film;
   a liquid crystal display driver IC chip connected to a first end portion of said plurality of groups of wiring lines;
   a plurality of first pitch groups of wiring lines provided at a second end portion of said plurality of groups of wiring lines; and
   a plurality of other pitch groups including second pitch groups of said wiring lines located at a plurality of portions between said first end portion and said second end portion of said plurality of groups of wiring lines, said other pitch groups having pitches different from each other and from those of said first pitch groups.

7. A film carrier type IC for driving liquid crystal display according to claim 6, in which said insulating tape is a tape of polyimide film.

8. A connecting tape for interconnecting wiring lines on a liquid crystal display panel and those on a driver IC, said connecting tape being constituted by an insulating tape having wiring layers provided on said insulating tape, said wiring layers comprising:
   a plurality of first pitch group wiring layers on an upper surface of one of end sides of said insulating tape;
   a plurality of second pitch group wiring layers on an upper surface of the other of the end sides of said insulating tape, said second pitch group having pitches different from those of said first pitch group wiring layers; and
   a plurality of third pitch group wiring layers pitches of which are different from both said first pitches and said second pitches and which are located between said one of the end sides and the other of the end sides of said insulating tape,
   said first pitch group wiring layers on the upper surface of said one of the end sides of said insulating tape being adapted to be aligned and connected with wiring lines of said liquid crystal display panel which lines are arranged in the same pitches as those of said first pitch group wiring layers, and said second pitch group wiring layers provided on the upper surface of the other of the end sides of said insulating tape being adapted to be aligned and connected with wiring lines of said driver IC.

* * * * *